United States Patent
Abe et al.

(10) Patent No.: US 9,929,699 B2
(45) Date of Patent: Mar. 27, 2018

(54) POWER AMPLIFIER CIRCUIT

(71) Applicant: Panasonic Corporation, Osaka (JP)

(72) Inventors: Takayuki Abe, Kanagawa (JP); Junji Sato, Tokyo (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/404,961

(22) Filed: Jan. 12, 2017

(65) Prior Publication Data

US 2017/0222604 A1 Aug. 3, 2017

(30) Foreign Application Priority Data

Jan. 29, 2016 (JP) .................... 2016-015445

(51) Int. Cl.
| | |
|---|---|
| *H03F 3/191* | (2006.01) |
| *H03F 1/30* | (2006.01) |
| *H03F 3/193* | (2006.01) |
| *H03F 3/24* | (2006.01) |
| *H03F 3/45* | (2006.01) |

(52) U.S. Cl.
CPC ............ *H03F 1/301* (2013.01); *H03F 3/193* (2013.01); *H03F 3/245* (2013.01); *H03F 3/45179* (2013.01); *H03F 3/45188* (2013.01); *H03F 2200/378* (2013.01); *H03F 2200/405* (2013.01); *H03F 2200/451* (2013.01); *H03F 2200/453* (2013.01); *H03F 2203/45576* (2013.01); *H03F 2203/45644* (2013.01)

(58) Field of Classification Search
CPC .................................. H03F 3/191; H03F 3/193
USPC ................................................. 330/137, 305
See application file for complete search history.

(56) References Cited

U.S. PATENT DOCUMENTS

2015/0145607 A1* 5/2015 Caffee ................. H03L 5/00
331/15
2016/0072442 A1* 3/2016 Testi ................. H03F 3/193
330/278

OTHER PUBLICATIONS

E. Abou-Allam et al., "Q-enhanced 1.9GHz tuned CMOS RF amplifier", IET Electronics Letters, vol. 32, No. 5, Feb. 29, 1996.

* cited by examiner

*Primary Examiner* — Steven J Mottola
(74) *Attorney, Agent, or Firm* — Greenblum & Bernstein, P.L.C.

(57) ABSTRACT

A power amplifier circuit includes N (N is an integer equal to or greater than 2) power amplifier circuit cores, which in operation, amplify power of an input signal, N inductors, which in operation, are connected to the N power amplifier circuit cores, and ring-oscillator-type transconductance (gm) generation circuitry, which in operation, generates transconductance (gm) for compensating power loss of the N inductors.

7 Claims, 6 Drawing Sheets

POWER AMPLIFIER CIRCUIT

BACKGROUND

1. Technical Field

The present disclosure relates to a power amplifier circuit.

2. Description of the Related Art

Recently, there has been an increasing shortage in radio frequency due to the increased use of radio technology such as radio communications and radar. One solution to relieve the shortage of frequency is to use a millimeter waveband, for example. Use of a millimeter waveband has already been implemented in some radio apparatuses. For example, the 60 GHz band is used in millimeter wave communication and the 79 GHz band is used in millimeter wave radar. With this background, a frequency band over 100 GHz, which is a higher frequency than the above frequencies, is expected to be utilized. A radio apparatus using a frequency band over 100 GHz is capable of occupying a broader band than conventional radio apparatus using a lower millimeter waveband. A radio apparatus using a frequency band over 100 GHz has accordingly been receiving attention from the viewpoint of the capability of implementing higher-speed communications and higher-resolution radar. Hence, use of radio ICs operating at over 100 GHz is widely anticipated.

The following issue arises in the development of radio ICs capable of operating at over 100 GHz. Specifically, a power amplifier circuit, which is a component of a radio IC, uses a passive component such as an inductor in its input or output circuit, for example. Performance of the inductor is represented by an index, the Q factor. The power amplifier requires an inductor with a high Q factor for gain enhancement. A configuration disclosed in "Q-enhanced 1.9 GHz tuned CMOS RF amplifier" IET Electronics Letters, VOL. 32, Issue: 5, February 1996 is widely known as a configuration for enhancing the Q factor.

SUMMARY

Nevertheless, the configuration disclosed in the above non-patent literature is not sufficient to enhance the Q factor in a frequency band over 100 GHz.

One non-limiting and exemplary embodiment provides a power amplifier circuit which enhances the Q factor, thereby enhancing power gain.

In one general aspect, the techniques disclosed here feature a power amplifier circuit including N (N is an integer equal to or greater than 2) power amplifier circuit cores, which in operation, amplify power of an input signal, N inductors, which in operation, are connected to the respective N power amplifier circuit cores, and ring-oscillator-type transconductance (gm) generation circuitry, which in operation, generates gm for compensating power loss of the N inductors.

According to the aspect of the present disclosure, it is possible to enhance the Q factor, thereby enhancing the power gain.

Additional benefits and advantages of the disclosed embodiments will become apparent from the specification and drawings. The benefits and/or advantages may be individually realized by the various embodiments and features of the specification and drawings, which need not all be provided in order to realize one or more of such benefits and/or advantages.

DETAILED DESCRIPTION (Underlying Knowledge Forming Basis of the Present Disclosure)

First, underlying knowledge forming the basis of the present disclosure is described. The present disclosure relates to a power amplifier circuit which operates in a frequency band over 100 GHz.

A radio IC is manufactured from a semiconductor material. The CMOS process is a method of manufacturing a radio IC. A transistor (radio IC) manufactured by the CMOS process has poorer performance in radio frequency than a transistor manufactured by other processes, and as a result, has difficulty in obtaining power gain in the radio frequency; however, its high integration is preferable for decreasing size and cost. In addition, a transistor manufactured by the scaled CMOS process is theoretically capable of operating at over 100 GHz. Using the CMOS process, development of radio ICs capable of operating at over 100 GHz is therefore expected.

In order to develop a radio IC capable of operating at over 100 GHz, the scaled CMOS process may be used to design the power amplifier circuit, which is a component of the radio IC. However, even using the scaled CMOS process, the design margin for implementing the operation at over 100 GHz is still small. Hence, the development of gain enhancement technology for the power amplifier circuit is desired in order for the radio IC to operate stably even when the radio IC is affected by characteristic deterioration due to variations in the process, voltage, and temperature (PVT).

Figure 1:
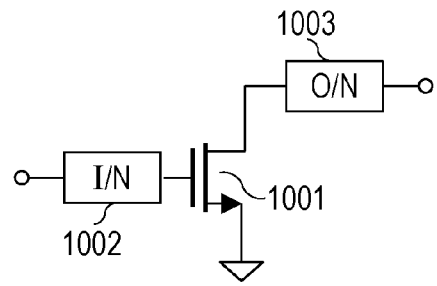
FIG. 1 illustrates a configuration of a conventional power amplifier circuit.

A configuration of a conventional power amplifier circuit is illustrated in FIG. 1. In FIG. 1, the power amplifier circuit includes an input transistor 1001, an input circuit 1002, and an output circuit 1003. FIG. 1 illustrates a single-ended configuration, that is, the input circuit 1002 and the output circuit 1003 connect to one input transistor 1001. Note that there is also a differential configuration, in which two input transistors each have an input circuit and an output circuit. When the power amplifier circuit is a differential amplifier, signals with different polarities are received by the respective input transistors.

In FIG. 1, a load is applied to each of the input circuit 1002 and the output circuit 1003. When the loads of the input circuit 1002 and the output circuit 1003 are conjugate-matched with each other, the power gain of the power amplifier circuit is, in theory, at maximum. The theoretical maximum power gain is called maximum available gain (MAG). Specifically, in order to realize the design margin, the design of the power amplifier circuit requires enhancement of the MAG.

The power amplifier circuit usually includes an inductor as an example of a passive component in its input and output circuits. An ideal inductor is a component which has a parameter, inductance L, and does not result in a power loss. However, an actual inductor has series parasitic resistance R as a parameter in addition to the inductance L. Hence, the inductor generates power loss and the MAG consequently decreases in a typical power amplifier circuit.

Performance of the inductor is represented by an index, the Q factor. The Q factor is defined as $\omega L/R$. This means that the Q factor increases as the series parasitic resistance R decreases, and the power loss in the inductor is reduced accordingly. Since the transistor used in the frequency band over 100 GHz originally has low MAG, the Q factor of the inductor is required to be high.

Figure 2:
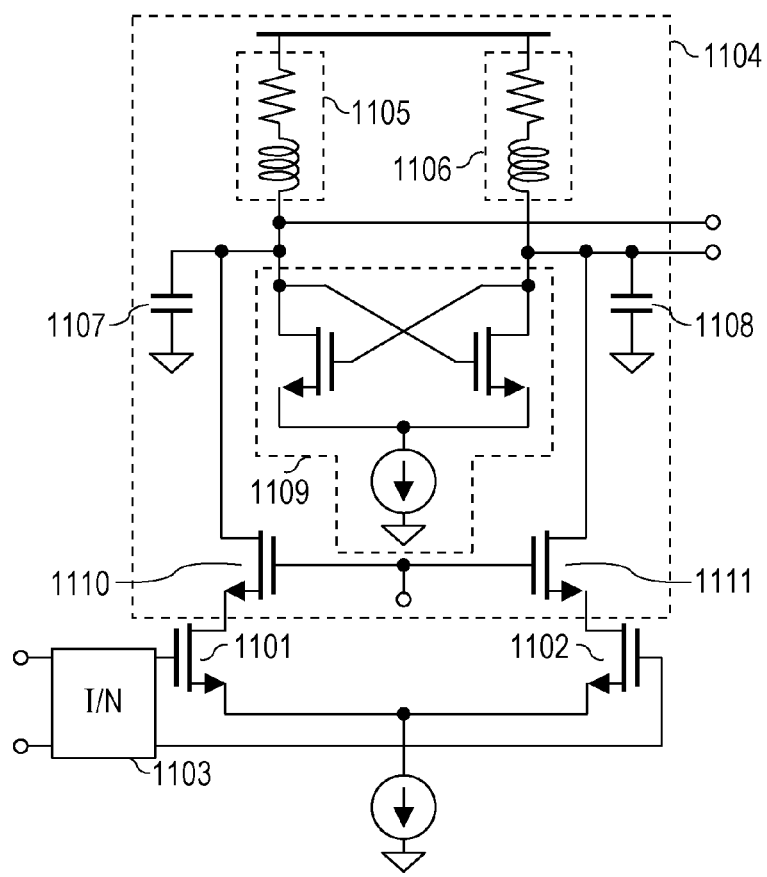
FIG. 2 illustrates a configuration of a power amplifier circuit on which a conventional Q factor compensation circuit is mounted.

The configuration of the literature is illustrated in FIG. 2 as a configuration example of a power amplifier circuit which enhances the Q factor. The power amplifier circuit disclosed in the literature is a differential power amplifier circuit including two input transistors 1101 and 1102, an input circuit 1103, and an output circuit 1104. The output circuit 1104 includes inductors 1105 and 1106, capacitors 1107 and 1108, a cross-coupled-oscillator-type gm generation circuit 1109, and cascode transistors 1110 and 1111.

In FIG. 2, when focusing on the configuration including the inductors 1105 and 1106, the capacitors 1107 and 1108, and the cross-coupled-oscillator-type gm generation circuit 1109, the configuration of the power amplifier circuit is identical to that of a cross-coupled oscillator circuit. Oscillation of the cross-coupled oscillator circuit is generated by cancelling out the parasitic resistance of the inductor by the cross-coupled-oscillator-type gm generation circuit generating transconductance (gm). The power amplifier circuit in the literature is based on this phenomenon. To be more specific, the Q factors of the inductors 1105 and 1106 are enhanced by decreasing the effective resistance value of the parasitic resistance in the inductors 1105 and 1106 with the gm of the cross-coupled-oscillator-type gm generation circuit 1109. The technique of enhancing the Q factor in the literature is called "Q enhancement" and is widely used to improve the performance of the passive component.

Meanwhile, in order to enhance the Q factor of the inductor around the maximum oscillation frequency (fmax) of the transistor included in the gm generation circuit, a phase difference between the input and output of the transistor needs to be an appropriate value. In the frequency band over 100 GHz, the appropriate phase difference for the Q factor enhancement changes depending on the value of the maximum oscillation frequency (fmax) of the transistor. However, since the configuration of the cross-coupled-oscillator-type gm generation circuit disclosed in the literature does not consider the phase difference between the input and output of the transistor, setting the phase difference to the appropriate value has been difficult.

In view of these problems, one aspect of the present disclosure describes a configuration of a gm generation circuit which makes Q enhancement possible at a frequency around the fmax, as well as a power amplifier circuit which uses this configuration.

Hereinafter, embodiments of the present disclosure are described in detail with reference to the drawings. Note that the embodiments described below are examples, and the present disclosure is not limited by the embodiments.

First Embodiment

[Configuration of Power Amplifier Circuit]

Figure 3:
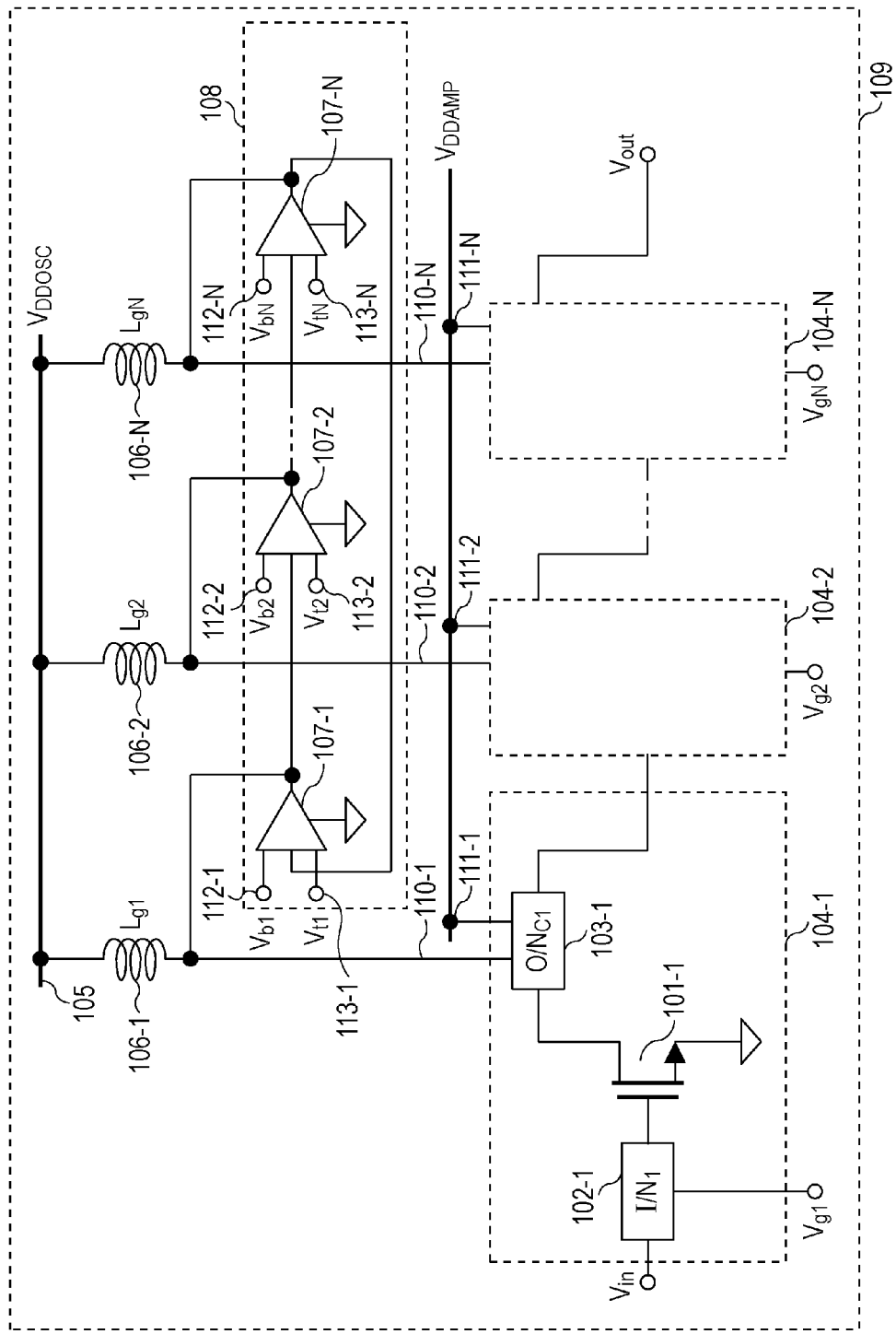
FIG. 3 illustrates a configuration example of a power amplifier circuit according to a first embodiment of the present disclosure.

FIG. 3 is a diagram illustrating a configuration example of a power amplifier circuit 109 according to a first embodiment. The power amplifier circuit 109 illustrated in FIG. 3 includes N (N is an integer equal to or greater than 2) power amplifier circuit cores 104-1 to 104-N, a ring-oscillator-type gm generation circuit 108, and N inductors 106-1 to 106-N.

The power amplifier circuit core 104-1 amplifies the power of an input signal $V_{in}$. To be more specific, the power amplifier circuit core 104-1 includes an input transistor 101-1, an input circuit 102-1 connected to an input terminal of the input transistor 101-1, and an output circuit core 103-1 connected to an output terminal of the input transistor 101-1.

Configurations of the other power amplifier circuit cores 104-2 to 104-N (not illustrated) are the same as the configuration of the power amplifier circuit core 104-1.

In the embodiment, the N power amplifier circuit cores 104-1 to 104-N are cascade-connected. To be more specific, the input signal $V_{in}$ is received by the input terminal of the power amplifier circuit core 104-1 at a first stage. Output from a power amplifier circuit core 104-($x$−1) at a preceding stage is received by an input terminal of a power amplifier circuit core 104-$x$ ($x$=2 to N) at an $x$th stage. An output terminal of a power amplifier circuit core 104-N at an Nth stage outputs an output signal $V_{out}$.

In each of the inductors 106-1 to 106-N, one terminal connects to an output circuit core 103 in a corresponding power amplifier circuit core 104, and the other terminal connects to a terminal of a power source $V_{DDOSC}$ (power source terminal for a gm generation circuit) 105. The inductance of each of the inductors 106-1 to 106-N is respectively denoted by $L_{g1}, L_{g2}, \ldots,$ and $L_{gN}$.

The ring-oscillator-type gm generation circuit 108 includes gm generation circuit cores 107-1 to 107-N which are connected to each other for N stages in a ring form. The ring-oscillator-type gm generation circuit 108 generates gm for compensating power loss of the inductors 106 connected to the power amplifier circuit cores 104. To be more specific, an output terminal of a gm generation circuit core 107-$x$ ($x$=1 to N) at an $x$th stage connects to an input terminal of the gm generation circuit core 107-($x$+1) at an ($x$+1)th stage. An output terminal of a gm generation circuit core 107-N at an Nth stage (that is, $x$=N) connects to an input terminal of the gm generation circuit core 107-1 at a first stage ($x$=1).

Each of the gm generation circuit cores 107-1 to 107-N connects to the one terminal of a corresponding inductor 106, the one terminal being connected to the output circuit core 103. Specifically, in FIG. 3, an inductor 106-$x$, in which the power loss is compensated by a corresponding gm generation circuit core 107-$x$, and a power amplifier circuit core 104-$x$, to which the inductor 106-$x$ connects, are connected to the gm generation circuit core 107-$x$.

Due to the configuration of the ring-oscillator-type gm generation circuit 108 provided with a ring oscillator for N stages including the gm generation circuit cores 107-1 to 107-N, the phase difference between the input and output can be obtained as k×2π/N (k is an integer). By adjusting the value of N (number of gm generation circuit cores 107), the phase difference between a targeted gm generation circuit core 107-x and a gm generation circuit core 107-(x+1) at the following stage becomes an optimum phase difference for generating an appropriate gm at a frequency around the maximum oscillation frequency (fmax).

By appropriately setting the phase difference by adjusting the stage number N of the gm generation circuit cores 107, the power amplifier circuit 109 decreases the effective resistance value of the parasitic resistance of the inductors 106 at a frequency around the fmax. The power amplifier circuit 109 can accordingly enhance the Q factor of the inductor 106-x, and thereby make possible the Q enhancement at a frequency around the fmax.

As described above, by the ring-oscillator-type gm generation circuit 108, the power amplifier circuit 109 according to the first embodiment compensates the power loss of the inductors 106 connected to the power amplifier circuit cores 104. After this compensation, by adjusting the stage number N of the gm generation circuit cores 107 included in the ring-oscillator-type gm generation circuit 108, the phase difference between the input and output of the transistor included in each gm generation circuit core 107 can be set to the appropriate value. Hence, according to the first embodiment, since the power amplifier circuit 109 can set the appropriate phase difference depending on the oscillation frequency even in the frequency band of 100 GHz, it is possible to enhance the Q factors of the inductors 106 even at a frequency around the fmax, and thereby enhance the MAG.

Next, configuration examples of the output circuit cores 103 will be described. Hereinafter, a configuration of the output circuit core 103-1 in the power amplifier circuit core 104-1 is described as an example.

[First Configuration Example of Output Circuit Cores (FIG. 4)]

Figure 4:
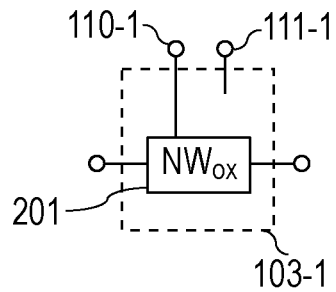
FIG. 4 illustrates a first configuration example of an output circuit core according to the first embodiment of the present disclosure.

The output circuit core 103-1 illustrated in FIG. 4 includes an output circuit network 201 (impedance network) connected to a drain of the input transistor 101-1 (FIG. 3). The output circuit network 201 includes a combination of a passive component and an active component, for example.

A terminal (inductor connection terminal) 110-1 of the output circuit network 201 connects to the inductor 106-1 (FIG. 3). This connection supplies a voltage to be applied to the power amplifier circuit core 104-1 from the terminal 110-1. A terminal 111-1 in the output circuit core 103-1 is open. In doing so, the output circuit core 103-1 shares the same power source with the gm generation circuit 108, and thereby the chip area of the output circuit core 103-1 can be reduced.

[Second Configuration Example of Output Circuit Cores (FIG. 5)]

Figure 5:
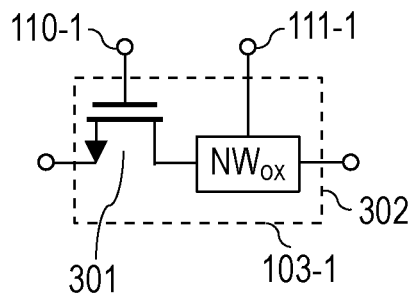
FIG. 5 illustrates a second configuration example of the output circuit core according to the first embodiment of the present disclosure.

The output circuit core 103-1 illustrated in FIG. 5 includes a transistor 301 (cascode transistor) and an output circuit network 302 (impedance network). A source of the transistor 301 connects to the drain of the input transistor 101-1 (FIG. 3). A drain of the transistor 301 connects to the output circuit network 302.

When the input transistor 101-1 is an nMOS transistor, the transistor 301 is also an nMOS transistor. The output circuit network 302 includes a combination of a passive component and an active component. The terminal 111-1 (power source terminal for a power amplifier circuit core) of the output circuit network connects to a power source $V_{DDAMP}$. The voltage to be applied to the power amplifier circuit core 104-1 is supplied by the terminal 111-1.

A gate of the transistor 301 connects to the inductor 106-1 (FIG. 3). This connection allows the power amplifier circuit core 104-1 to include not only the transistor 101-1 but also the transistor 301, which also has a power amplifying function. Thereby, the MAG can be enhanced. Note that the power amplifier circuit core 104-1 may share the supplied power source with the inductor 106-1.

So far, the configuration examples of the output circuit cores 103 have been described.

Next, configuration examples of the gm generation circuit cores 107 will be described. Hereinafter, a configuration of the gm generation circuit core 107-1 is described as an example. In FIGS. 6 to 9 which illustrate the configuration of the gm generation circuit core 107-1 according to later-described first to fourth configuration examples, the same reference symbols are given to the same configurations, and duplicated descriptions are omitted.

[First Configuration Example of gm Generation Circuit Cores (FIG. 6)]

Figure 6:
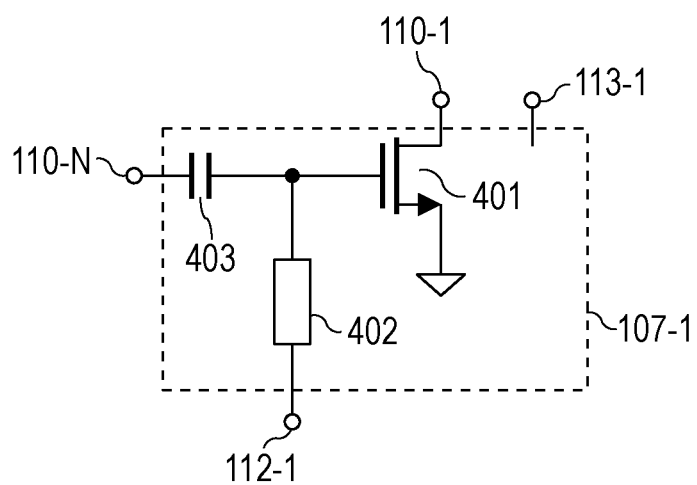
FIG. 6 illustrates a first configuration example of a gm generation circuit core according to the first embodiment of the present disclosure.

The gm generation circuit core 107-1 illustrated in FIG. 6 includes a transistor 401 (gm generator transistor), an impedance circuit 402, and a capacitor 403.

The impedance circuit 402 includes a resistor, an inductor, a transmission line, or any of these. The impedance circuit 402 and the capacitor 403 connect to a gate of the transistor 401. Output from a gm generation circuit core 107-N is received by the gm generation circuit core 107-1 via a terminal 110-N. Output from the gm generation circuit core 107-1 is received by the gm generation circuit core 107-2 via the terminal 110-1.

In the gm generation circuit core 107-1, a value of a signal $V_{b1}$, which is a first control signal received via a terminal (current adjustment terminal) 112-1, sets a gate potential of the transistor 401, thereby controlling a current flowing through the transistor 401. Due to the value of the current flowing through the transistor 401, the gm generation circuit core 107-1 according to the first configuration example can control the frequency, which enhances the Q factor. Meanwhile, a terminal (variable capacitor adjustment terminal) 113-1 is open.

[Second Configuration Example of gm Generation Circuit Cores (FIG. 7)]

Figure 7:
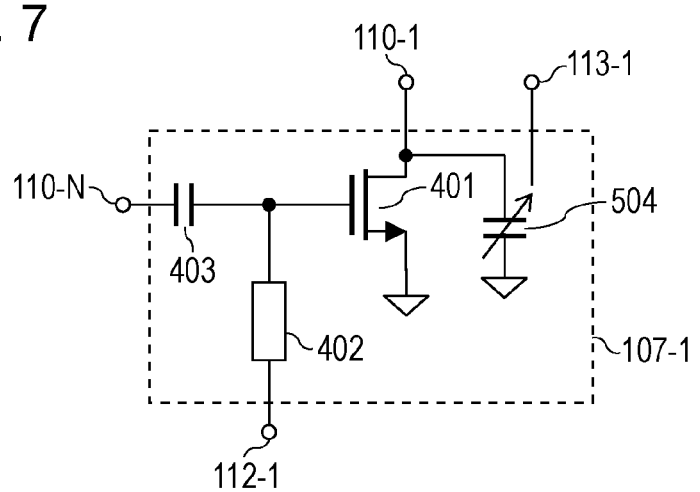
FIG. 7 illustrates a second configuration example of the gm generation circuit core according to the first embodiment of the present disclosure.

The configuration of the gm generation circuit core 107-1 illustrated in FIG. 7 is the configuration of the first configuration example (FIG. 6) with a variable capacitor 504 added thereto.

The variable capacitor 504 connects to a drain of the transistor 401. A value of a signal $V_{t1}$, which is a second control signal received via the terminal (variable capacitor adjustment terminal) 113-1, controls capacitance of the variable capacitor 504. The signal $V_{t1}$ received by the terminal 113-1 may be either an analog or a digital value.

Due to the value of the current flowing through the transistor 401 controlled by the signal $V_{b1}$ and the capacitance of the variable capacitor 504 controlled by the signal $V_{t1}$, the gm generation circuit core 107-1 according to the second configuration example can control the frequency, which enhances the Q factor. This widens the adjustable frequency range compared with that of the first configuration example.

[Third Configuration Example of gm Generation Circuit Cores (FIG. 8)]

Figure 8:
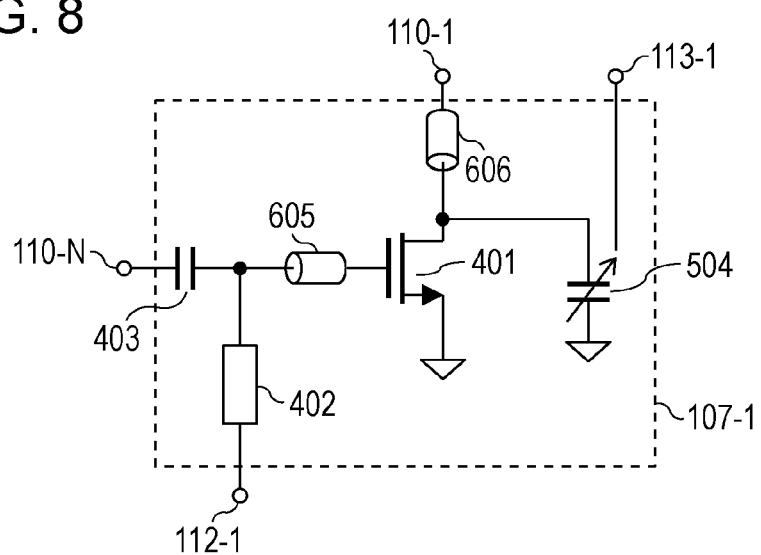
FIG. 8 illustrates a third configuration example of the gm generation circuit core according to the first embodiment of the present disclosure.

The configuration of the gm generation circuit core 107-1 illustrated in FIG. 8 is the configuration of the second configuration example (FIG. 7) with transmission lines 605 and 606 added thereto.

The transmission line 605 (input transmission line) has one side connecting to the gate of the transistor 401 and the other side connecting to the impedance circuit 402. The transmission line 606 (output transmission line) has one side connecting to the drain of the transistor 401 and the other side connecting to the terminal 110-1.

By adjusting the lengths of the transmission lines 605 and 606, the gm generation circuit core 107-1 according to a third configuration example sets the phase difference and amplitude difference between the input and output of the transistor 401. Hence, the third configuration example enables the optimum phase difference and amplitude difference at a predetermined frequency, which are better than those in the second configuration example, and thereby transconductance gm in the predetermined frequency can be enhanced.

[Fourth Configuration Example of gm Generation Circuit Cores (FIG. 9)]

Figure 9:
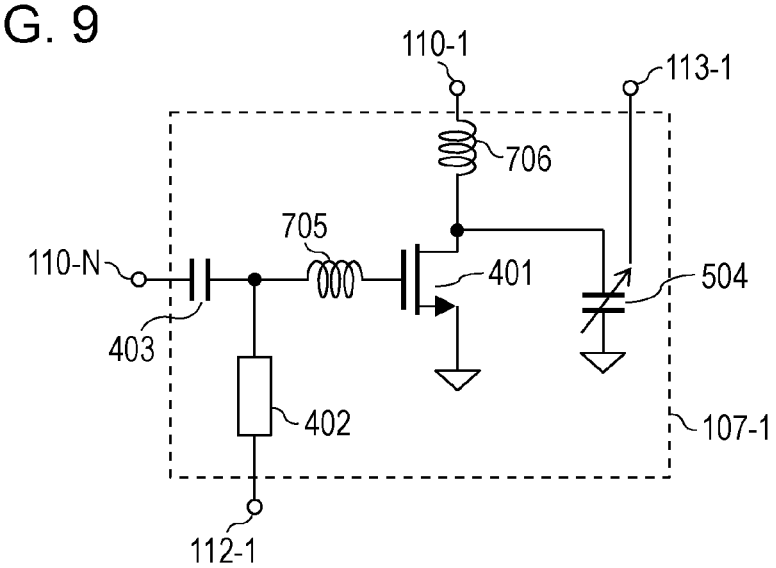
FIG. 9 illustrates a fourth configuration example of the gm generation circuit core according to the first embodiment of the present disclosure.

The configuration of the gm generation circuit core 107-1 illustrated in FIG. 9 is the configuration of the third configuration example (FIG. 8), except with inductors 705 and 706 provided thereto instead of the transmission lines 605 and 606.

The inductor 705 (input inductor) has one side connecting to the gate of the transistor 401 and the other side connecting to the impedance circuit 402. The inductor 706 (output inductor) has one side connecting to the drain of the transistor 401 and the other side connecting to the terminal 110-1.

By adjusting the inductance of the inductors 705 and 706, the gm generation circuit core 107-1 according to the fourth configuration example sets the phase difference and the amplitude difference between the input and output of the transistor 401. Hence, as with the third configuration example, the fourth configuration example enables the optimum phase difference and amplitude difference at the predetermined frequency, which are better than those in the second configuration example, and thereby transconductance gm at the predetermined frequency can be enhanced.

In addition, the inductors 705 and 706 in the fourth configuration example can be made smaller than the transmission lines 605 and 606 in the third configuration example. The gm generation circuit core 107-1 in the fourth configuration example can accordingly be made smaller than that in the third configuration example.

So far, the configuration examples of the gm generation circuit cores have been described.

Second Embodiment

Figure 10:
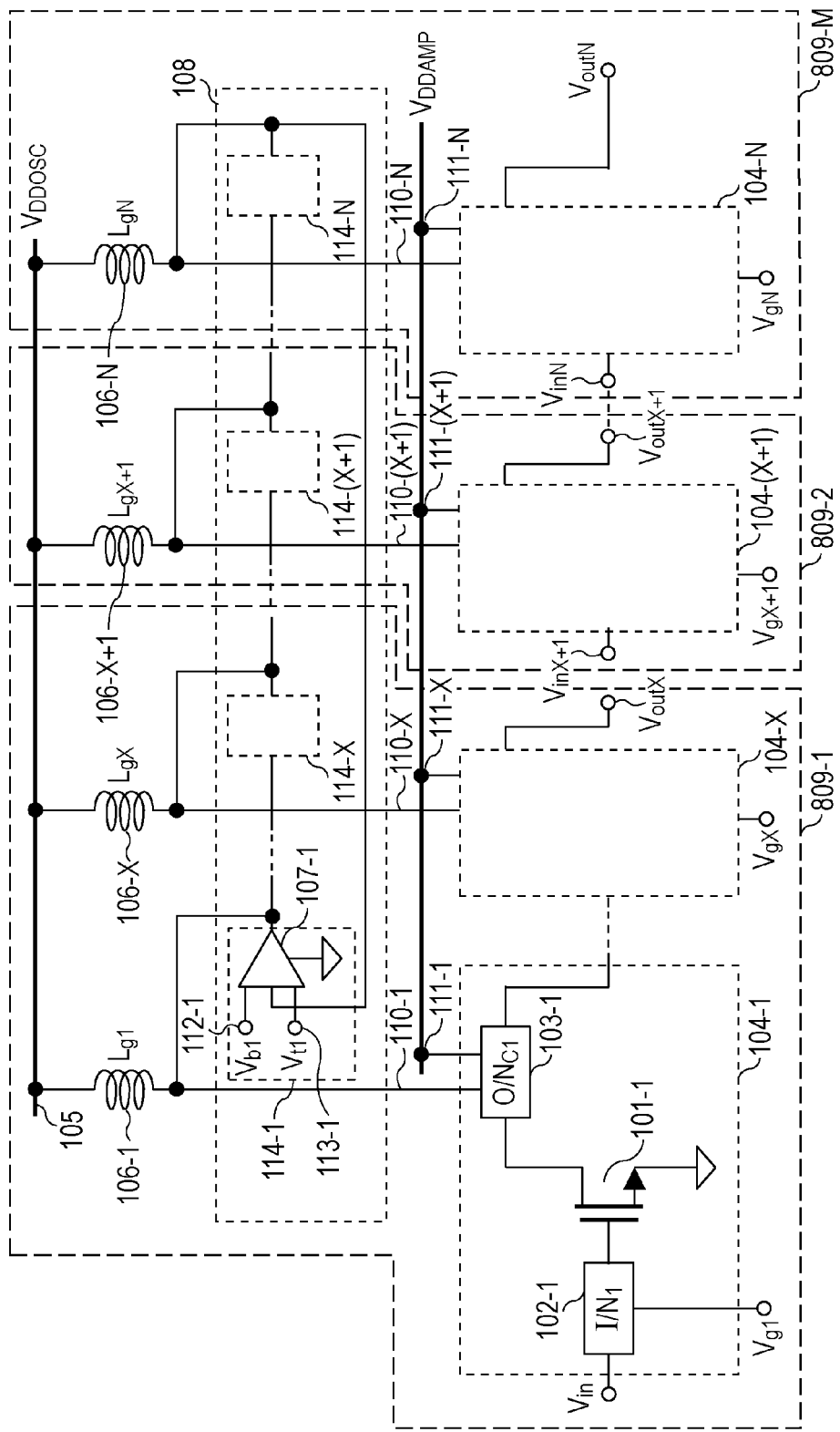
FIG. 10 illustrates a configuration example of a power amplifier circuit according to a second embodiment of the present disclosure.

FIG. 10 is a diagram illustrating a configuration example of a power amplifier circuit according to a second embodiment. In FIG. 10, note that the configuration same as that of the first embodiment (FIG. 3) is denoted by the same reference sign in FIG. 3, and its description is omitted.

In FIG. 10, to simplify the diagram, a configuration including the gm generation circuit core 107-1 and the terminals 112-1 and 113-1 in the ring-oscillator-type gm generation circuit 108 is denoted by a configuration 114-1. Likewise, configurations at second and following stages are denoted by configurations 114-2 to 114-N.

The configuration of the power amplifier circuit 109 according to the first embodiment (FIG. 3) includes the N power amplifier circuit cores 104-1 to 104-N which are cascade-connected. On the other hand, in the configuration of FIG. 10, X (X is an integer equal to or greater than 1 but less than N) of the N power amplifier circuit cores 104-1 to 104-N are connected in series. In other words, one or more power amplifier circuit cores 104 of the N power amplifier circuit cores 104-1 to 104-N are indirectly connected. Hence, power amplifier circuits 809 according to the second embodiment include M (M is an integer equal to or greater than 2 but less than N) power amplifier circuits 809-1 to 809-M.

For example, the power amplifier circuit 809-1 includes the power amplifier circuit cores 104-1 to 104-X connected for X stages, the gm generation circuit cores 107-1 to 107-X respectively corresponding to the power amplifier circuit cores 104-1 to 104-X, and the inductors 106-1 to 106-X respectively corresponding to the power amplifier circuit cores 104-1 to 104-X.

A power amplifier circuit 809-2 includes a power amplifier circuit core 104-(X+1) at a stage, a gm generation circuit core 107-(X+1) corresponding to the power amplifier circuit core 104-(X+1), and an inductor 106-(X+1).

Rest of the power amplifier circuits 809 have the same configuration.

As described above, the power amplifier circuits 809 according to the second embodiment include M (M is an integer equal to or greater than 2 but less than N) power amplifier circuits 809-1 to 809-M. The M power amplifier circuits 809-1 to 809-M can be used as power amplifier circuits for multiple different devices (such as a transmitter and a receiver, multiple transmitters, or multiple receivers), for example. The number M of the power amplifier circuits 809 may be set depending on the number (stage number) of the connected power amplifier circuit cores 104 required for the devices, for example.

As with the first embodiment, each of the gm generation circuit cores 107-$x$ ($x$=1 to N) in the ring-oscillator-type gm generation circuit 108 in FIG. 10 connects to the corresponding inductor 106-$x$ in which the power loss is compensated by the gm generation circuit core 107-$x$, and to the corresponding power amplifier circuit core 104-$x$ to which the inductor 106-$x$ connects.

Hence, as with the first embodiment, due to the configurations of the power amplifier circuits 809-1 to 809-M, in which the ring oscillators for N stages including the gm generation circuit cores 107-1 to 107-N, the phase difference between the input and output can be obtained as k×2π/N (k is an integer). This configuration allows adjustment of the value of N, and thereby the phase difference between the targeted gm generation circuit core 107-$x$ and the gm generation circuit core 107-$(x+1)$ at the following stage becomes the optimum phase difference for generating the appropriate gm at a frequency around the maximum oscillation frequency (fmax). By appropriately setting the phase difference with adjusting the stage number N of the gm generation circuit cores 107, the power amplifier circuits 809-1 to 809-M can enhance the Q factor of the inductor 106-$x$, and thereby make possible the Q enhancement at a frequency around the fmax. In addition, in the second embodiment, each of the power amplifier circuits 809-1 to 809-M can use one ring-oscillator-type gm generation circuit 108.

The case of using the power amplifier circuit cores 104-1 to 104-N is described in FIG. 10; however, in each power amplifier circuit 809, part of the power amplifier circuit cores 104 may be replaced with a dummy circuit (not illustrated) if necessary. This allows the M power amplifier circuits 809 to maintain the optimal phase difference controlled by the ring-oscillator-type gm generation circuit 108. Hence, an unnecessary power amplifier circuit core 104 is reduced, and unnecessary power consumption is accordingly reduced. Note that the configuration of replacing part of the power amplifier circuit cores 104 with the dummy circuit can also be used for another embodiment.

Third Embodiment

A calibration method for the power amplifier circuit is described in a third embodiment.

Figure 11:
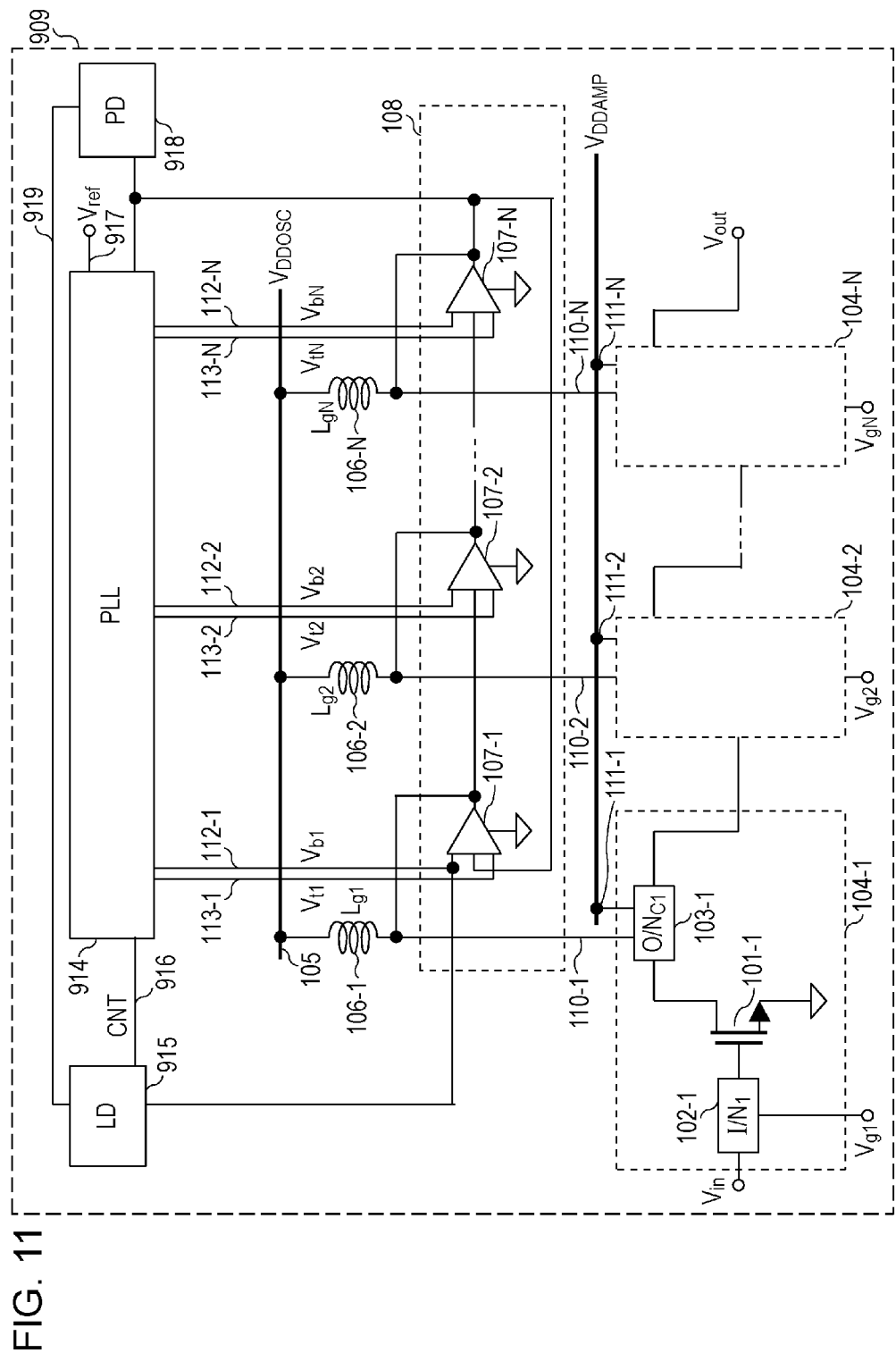
FIG. 11 illustrates a configuration example of a power amplifier circuit according to a third embodiment of the present disclosure.

FIG. 11 is a diagram illustrating a configuration example of a power amplifier circuit according to the third embodiment. In FIG. 11, note that the configuration same as that of the first embodiment (FIG. 3) or the second embodiment (FIG. 10) is denoted by the same reference sign in FIGS. 3 and 10, and its description is omitted.

In FIG. 11, a configuration of a power amplifier circuit 909 is the configuration in the first embodiment (FIG. 3) with a phase locked loop (PLL) 914, a lock detector (LD) circuit 915, and a power detector (PD) circuit 918 added thereto. Otherwise, the power amplifier circuit 909 may have the configuration (not illustrated) in the second embodiment (FIG. 10) with the PLL 914, the LD circuit 915, and the PD circuit 918 added thereto.

The PLL 914 receives, as input, output from the ring-oscillator-type gm generation circuit 108, a reference signal $V_{ref}$ via a terminal 917 (reference input terminal), and a CNT signal (control signal) via a terminal 916 (PLL control terminal) from the LD circuit 915.

The PLL 914 generates control signals $V_{b1}$ to $V_{bN}$ and control signals $V_{t1}$ to $V_{tN}$ on the basis of the reference signal $V_{ref}$, output from the ring-oscillator-type gm generation circuit 108, and the CNT signal. The PLL 914 controls the oscillation frequency of the ring-oscillator-type gm generation circuit 108 on the basis of the control signals $V_{b1}$ to $V_{bN}$ and $V_{t1}$ to $V_{tN}$.

To the gm generation circuit cores 107-1 to 107-N in the ring-oscillator-type gm generation circuit 108, the PLL 914 inputs values of the signals $V_{b1}$ to $V_{bN}$ (hereinafter, combined and denoted by "$V_b$") via the terminals 112 (current adjustment terminal), and also inputs values of the signals $V_{t1}$ to $V_{tN}$ (hereinafter, combined and denoted by "$V_t$") via the terminals 113 (variable capacitor adjustment terminal).

The PD circuit 918 detects power (hereinafter, referred to as "oscillation power") at the oscillation frequency of the ring-oscillator-type gm generation circuit 108. The PD circuit 918 outputs a signal indicating a detection result of the oscillation power of the ring-oscillator-type gm generation circuit 108 to the LD circuit 915 via a terminal 919 (power detection result output terminal).

The LD circuit 915 connects to the terminal 919, to which the detection result of the PD circuit 918 is outputted, and one of the terminals 112 (current adjustment terminal) of the gm generation circuit cores 107.

The LD circuit 915 detects a lock state of the oscillation frequency of the ring-oscillator-type gm generation circuit 108. For example, when the control signals $V_b$ received via the terminals 112 have constant potentials, the LD circuit 915 determines that the oscillation frequency is locked, and then outputs the CNT signal indicating locking of the oscillation frequency to the PLL 914. After detecting locking of the oscillation frequency, the LD circuit 915 outputs the CNT signal indicating the stop of the oscillation to the PLL 914 when the LD circuit 915 receives a signal indicating no detection of the oscillation power from the PD circuit 918 (that is, when the oscillation stops).

Next, the calibration method according to the third embodiment will be described in details.

Hereinafter, each of the gm generation circuit cores 107 in the ring-oscillator-type gm generation circuit 108 which includes the variable capacitor 504 illustrated in FIGS. 7 to 9 is described.

The PLL 914 includes a frequency divider which divides the oscillation frequency of the ring-oscillator-type gm generation circuit 108. The PLL 914 compares the divided frequency and frequency of the reference signal $V_{ref}$, and adjusts the values of the signals $V_b$ or the values of the signals $V_t$ such that the compared frequencies are equal to each other.

For example, when the frequency of the reference signal $V_{ref}$ is a frequency $f_{ref}$ and a division ratio of the frequency divider is n (n is a positive integer), the oscillation frequency of the ring-oscillator-type gm generation circuit 108 is ($f_{ref} \times n$). Note that either or both of $f_{ref}$ and n are variable. To be more specific, the value of $f_{ref}$ or n may be set depending on the targeted frequency (frequency at which power gain in the power amplifier circuit 909 is wanted to be enhanced).

First, as a first state, the PLL 914 sets the values of the signals $V_t$ such that the capacitance of the variable capacitor 504 in each gm generation circuit core 107 becomes the minimum, and inputs the signals $V_t$ to the terminals 113.

After setting to the first state, the PLL 914 controls the oscillation frequency of the ring-oscillator-type gm generation circuit 108 by adjusting the values of the signals $V_b$ to be applied to the terminals 112. In other words, the PLL 914 adjusts the values of the signals $V_b$ such that the value of the oscillation frequency of the ring-oscillator-type gm generation circuit 108 becomes $f_{ref} \times n$.

When the potentials of the signals $V_b$ becomes constant, the LD circuit 915 determines that the PLL 914 locks the oscillation frequency of the ring-oscillator-type gm generation circuit 108, and outputs the CNT signal indicating locking of the oscillation frequency to the PLL 914.

Thereafter, when the PLL 914 receives the CNT signal indicating locking of the oscillation frequency, the PLL 914 sets the values of the signals $V_t$ such that the capacitance of the variable capacitor 504 increases, and inputs the signals $V_t$ to the terminals 113. In this second state where the capacitance of the variable capacitor 504 is increased, the PLL 914 controls again the oscillation frequency of the ring-oscillator-type gm generation circuit 108 by adjusting the values of the signals $V_b$ to be applied to the terminals 112.

Thus, in order to lock the value of the oscillation frequency of the ring-oscillator-type gm generation circuit 108 to $f_{ref} \times n$ under a condition where the capacitance of the variable capacitor 504 increases, the PLL 914 adjusts the values of the signals $V_b$ such that the current flowing through the gm generation circuit cores 107 is decreased. Decrease of the current flowing through the gm generation circuit cores 107 decreases the gm generated in the gm generation circuit cores 107. Hence, the ring-oscillator-type gm generation circuit 108 becomes less likely to oscillate.

Until the PD circuit 918 detects no oscillation power, the PLL 914 and the LD circuit 915 perform the adjustment process (loop process) of the above signals $V_t$ and $V_b$.

When no oscillation power is detected (when the output power of the ring-oscillator-type gm generation circuit 108 is under a predetermined threshold, for example), the PD circuit 918 outputs a signal indicating the stop of the oscillation of the ring-oscillator-type gm generation circuit 108 to the LD circuit 915 via the terminal 919 (power detection result output terminal).

After detecting locking of the oscillation frequency, the LD circuit 915 determines that the oscillation of the ring-oscillator-type gm generation circuit 108 stops when the signal indicating the stop of the oscillation of the ring-oscillator-type gm generation circuit 108 is detected. Then, the LD circuit 915 stops the control loop of the PLL 914 by using the CNT signal and fixes the values of the signals $V_b$ and $V_t$.

As described above, as the first state, the PLL 914 controls the control signals $V_t$ to be applied to the terminals 113 (variable capacitor adjustment terminal) in order to minimize the capacitance of each variable capacitor 504 of the gm generation circuit cores 107. After setting to the first state (after the capacitance of the variable capacitor 504 is minimized), the PLL 914 controls the control signals $V_b$ to be applied to the terminals 112 (current adjustment terminal) and causes the ring-oscillator-type gm generation circuit 108 to output the oscillation power at the oscillation frequency. When the LD circuit 915 detects locking of the oscillation frequency (after the ring-oscillator-type gm generation circuit 108 outputs the oscillation power), the PLL 914 controls again the control signals $V_t$ to be applied to the terminals 113 in order to increase the capacitance of the variable capacitor 504 (second state) until the LD circuit 915 detects no locked oscillation frequency.

Thus, the PLL 914 changes the capacitance of the variable capacitor 504 from the first state with the minimum capacitance (that is, the state where the gm is the maximum) to the second state with the capacitance gradually increased (that is, the state where the gm is gradually decreased) and specifies a point where the oscillation of the ring-oscillator-type gm generation circuit 108 stops. With this process, the values of the signals $V_b$ and $V_t$ at the timing where the control loop stops are the values which cause Q factors of the inductors 106 to become the maximum when the ring-oscillator-type gm generation circuit 108 does not oscillate.

Hence, according to the third embodiment, even when the Q factors of the inductors 106 are not optimum because a parameter on the ring-oscillator-type gm generation circuit 108 has a gap between the design and the actual activation, the PLL 914 can obtain the optimum Q factors by adjusting the parameter to the appropriate value, and thereby the MAG of the power amplifier circuit 909 can be enhanced.

In the third embodiment, when the PD circuit 918 detects no power at the oscillation frequency even if the initial value of the variable capacitor 504 is minimized, the capacitance of the variable capacitor 504 may be changed from the minimum value to a greater value. With this process, the power amplifier circuit 909 can prevent a detection error in the PD circuit 918. For example, the maximum value of the gm can be obtained from the optimum values of the signals $V_b$.

Additionally, there may be a case where the value of the gm is not the maximum because the values of the signals $V_b$ have potentials allowing more current to flow than the potentials of the optimum values of the signals $V_b$ do, and thereby the ring-oscillator-type gm generation circuit 108 does not oscillate. Also in this case, the power amplifier circuit 909 can prevent the detection error in the PD circuit 918 by adding the process of changing the capacitance of the variable capacitor 504.

Moreover, the PLL 914 may use a method of decreasing the value of the current gradually in large steps at the initial stage of the adjustment and increasing the value of the current gradually in small steps after the oscillation of the ring-oscillator-type gm generation circuit 108 stops.

Specifically, in order to maximize the capacitance of each variable capacitor 504 of the gm generation circuit cores 107, the PLL 914 starts with controlling the control signals $V_t$ to be applied to the terminals 113 (variable capacitor adjustment terminal). After maximizing the capacitance of the variable capacitor 504, the PLL 914 controls the control signals $V_b$ to be applied to the terminals 112 (current adjustment terminal) and causes the ring-oscillator-type gm generation circuit 108 to output the oscillation power at the oscillation frequency. After the PD circuit 918 detects the oscillation power (after the ring-oscillator-type gm generation circuit 108 outputs the oscillation power), the PLL 914 controls again the control signals $V_t$ to be applied to the terminals 113 (variable capacitor adjustment terminal) in order that the oscillation frequency can be locked by decreasing the capacitance of the variable capacitor 504 stepwise with a first step width. After locking the oscillation frequency, the PLL 914 controls again the control signals $V_t$ to be applied to the terminals 113 to increase the capacitance of the variable capacitor 504 stepwise with a second step width which is smaller than the first step width.

Thus, the power amplifier circuit 909 in FIG. 11 can enhance a convergence rate of the control loop (adjustment of $V_b$ and $V_t$) by the PLL 914. Note that the PLL 914 may use a method of increasing the value of the current stepwise in large steps at the initial stage of the adjustment and decreasing the value of the current stepwise in small steps after determining the oscillation of the ring-oscillator-type gm generation circuit 108.

The PD circuit 918 may include a built-in A/D converter (ADC) with a multiple-bit resolution, detect amplitude of the output of the ring-oscillator-type gm generation circuit 108 by the ADC, and determine the size of the gm of the gm generation circuit cores 107.

The LD circuit 915 may connect to the reference input terminal 917 and a terminal (not illustrated) which outputs the divided frequency in the PLL 914 instead of the current adjustment terminal 112-1. In this case, the LD circuit 915 has a frequency comparator which compares the frequency of the reference and the divided frequency in the PLL 914, and the LD circuit 915 determines a state as a locked state, where there is no frequency difference, or an unlocked state, where there is a frequency difference. For example, the frequency comparator includes a counter and measures the frequencies by counting how many times the reference signal and the dividing signal exceed a threshold within a limited time.

So far, embodiments according to the aspect of the present disclosure have been described.

All of the inductance $L_{g1}$, $L_{g2}$, . . . , and $L_{gN}$ of the inductors 106-1 to 106-N may be the same values, different values, or variables. The input transistors 101, the input circuits 102, and the output circuit cores 103 which are included in the power amplifier circuit cores 104-1 to 104-N may have either the same or different configurations. All of the gm generation circuit cores 107-1 to 107-N included in the ring-oscillator-type gm generation circuit 108 may have the same or different configurations. For example, in order to enhance linearity of the power amplifier circuit 109, power amplifier circuit cores 104 at later steps in the power amplifier circuit cores 104-1 to 104-N preferably use the input transistors 101 having larger transistor sizes. Parameters of the parasitic elements of the transistors have different values when the input transistors 101 have different transistor sizes. Hence, the power amplifier circuit cores 104-1 to 104-N need to adjust sizes of the input circuits 102, the output circuit cores 103, and the inductors 106.

In addition, the above embodiments describe the case where one inductor 106 and one gm generation circuit core 107 connect to one power amplifier circuit core 104 (or the dummy circuit). In other words, described is a configuration where each of the number of the power amplifier circuit cores 104, the number of the inductors 106, and the number of the gm generation circuit cores 107 is N. However, the aspect of the present disclosure is not limited to this configuration and, for example, the number of the power amplifier circuit cores 104 may be under N. Also in this case, the gm generation circuit cores 107 for N steps enhance the Q factor in a radio frequency band, and thereby the MAG can be enhanced.

<Overview of Present Disclosure>

A power amplifier circuit according to a first aspect of the present disclosure includes N (N is an integer equal to or greater than 2) power amplifier circuit cores, which in operation, amplify power of an input signal, N inductors, which in operation, are connected to the respective N power amplifier circuit cores, and ring-oscillator-type transconductance (gm) generation circuitry, which in operation, generates gm for compensating power loss of the N inductors.

A power amplifier circuit according to a second aspect of the present disclosure is the power amplifier circuit according to the first aspect of the present disclosure, in which the ring-oscillator-type gm generation circuitry includes N gm generation circuit cores, which in operation, are connected to each other in a ring form, each of the gm generation circuit cores is connected to the corresponding inductor and the corresponding power amplifier circuit core, and the N power amplifier circuit cores are connected to each other in series.

A power amplifier circuit according to a third aspect of the present disclosure is the power amplifier circuit according to the first aspect of the present disclosure, in which the ring-oscillator-type gm generation circuitry includes N gm generation circuit cores, which in operation, are connected to each other in a ring form, each of the gm generation circuit cores is connected to the corresponding inductor and the corresponding power amplifier circuit core, and of the N power amplifier circuit cores, X (X is an integer equal to or greater than 1 but less than N) power amplifier circuit cores are connected to each other in series.

A power amplifier circuit according to a fourth aspect of the present disclosure is the power amplifier circuit according to the first aspect of the present disclosure, in which at least one of the N power amplifier circuit cores is a dummy circuit.

A power amplifier circuit according to a fifth aspect of the present disclosure is the power amplifier circuit according to the first aspect of the present disclosure, in which the ring-oscillator-type gm generation circuitry includes N gm generation circuit cores, which in operation, are connected to each other in a ring form, and each of the gm generation circuit cores includes a current adjustment terminal receiving a first control signal and a variable capacitor adjustment terminal receiving a second control signal, the first control signal being used for controlling a current flowing through each of the gm generation circuit cores, and the second control signal being used for controlling capacitance of a variable capacitor included in each of the gm generation circuit cores.

A power amplifier circuit according to a sixth aspect of the present disclosure is the power amplifier circuit according to the fifth aspect of the present disclosure which includes a PLL, which in operation, controls oscillation frequency of the ring-oscillator-type gm generation circuitry on the basis of the first control signal and the second control signal, lock detection circuitry, which in operation, detects a lock state of the oscillation frequency of the ring-oscillator-type gm generation circuit, and power detection circuitry, which in operation, detects oscillation power at the oscillation frequency of the ring-oscillator-type gm generation circuitry.

A power amplifier circuit according to a seventh aspect of the present disclosure is the power amplifier circuit according to the sixth aspect of the present disclosure, in which: the PLL controls the second control signal to minimize the capacitance of the variable capacitor; after minimizing the capacitance of the variable capacitor, the PLL controls the first control signal to cause the ring-oscillator-type gm generation circuitry to output the oscillation power at the oscillation frequency; and after the ring-oscillator-type gm generation circuitry outputs the oscillation power at the oscillation frequency, the PLL controls again the second control signal to increase the capacitance of the variable capacitor.

A power amplifier circuit according to an eighth aspect of the present disclosure is the power amplifier circuit according to the sixth aspect of the present disclosure, in which: the PLL controls the second control signal to maximize the capacitance of the variable capacitor; after maximizing the capacitance of the variable capacitor, the PLL controls the first control signal to cause the ring-oscillator-type gm generation circuitry to output the oscillation power at the oscillation frequency; after the ring-oscillator-type gm generation circuitry outputs the oscillation power at the oscillation frequency, the PLL controls again the second control signal to lock the oscillation frequency by decreasing the capacitance of the variable capacitor stepwise with a first step width; and after locking of the oscillation frequency, the PLL controls again the second control signal to increase the capacitance of the variable capacitor stepwise with a second step width which is smaller than the first step width.

So far, various embodiments have been described with reference to the drawings; however, it is obvious that the present disclosure is not limited to such examples. Those skilled in the art obviously arrive at various modifications and changed examples in the scope described in the claims, and such modifications and changed examples are also obviously understood to belong to a technical scope of the present disclosure. Additionally, the components in the above embodiments may be arbitrarily combined without departing from the scope of the disclosure.

In the above embodiments, the present disclosure is described with an example of a configuration using hardware; however, the present disclosure may be implemented with software cooperating with the hardware.

Each functional block used in the description of each embodiment described above can be partly or entirely realized by an LSI such as an integrated circuit, and each process described in the each embodiment may be controlled partly or entirely by the same LSI or a combination of LSIs. The LSI may be individually formed as chips, or one chip may be formed so as to include a part or all of the functional blocks. The LSI may include a data input and output coupled thereto. The LSI here may be referred to as an IC, a system LSI, a super LSI, or an ultra LSI depending on a difference in the degree of integration. However, the technique of implementing an integrated circuit is not limited to the LSI and may be realized by using a dedicated circuit, a general-purpose processor, or a special-purpose processor.

In addition, a FPGA (Field Programmable Gate Array) that can be programmed after the manufacture of the LSI or a reconfigurable processor in which the connections and the settings of circuit cells disposed inside the LSI can be reconfigured may be used. The present disclosure can be realized as digital processing or analogue processing.

Moreover, if future integrated circuit technology replaces LSIs as a result of the advancement of semiconductor technology or other derivative technology, the functional blocks could be integrated using the future integrated circuit technology. Biotechnology can also be applied.

The aspect of the present disclosure is preferable for use in a radar device or a communication device which operate on the frequency band of 100 GHz.

What is claimed is:

1. A power amplifier circuit comprising:
N power amplifier circuit cores, which in operation, amplify power of an input signal, wherein N is an integer equal to or greater than 2;
N inductors, which in operation, are connected to the respective N power amplifier circuit cores; and
ring-oscillator-type transconductance (gm) generation circuitry, which in operation, generates gm for compensating power loss of the N inductors; and
at least X power amplifier circuit cores of the N power amplifier circuit cores are connected to each other in series, wherein X is an integer equal to or greater than 2.

2. The power amplifier circuit according to claim 1,
wherein the ring-oscillator-type gm generation circuitry includes N gm generation circuit cores, which in operation, are connected to each other in a ring form, and
each of the gm generation circuit cores is connected to the corresponding inductor and the corresponding power amplifier circuit core.

3. The power amplifier circuit according to claim 1,
wherein at least one of the N power amplifier circuit cores is a dummy circuit.

4. A power amplifier circuit, comprising:
N power amplifier circuit cores, which in operation, amplify power of an input signal, wherein N is an integer equal to or greater than 2;
N inductors, which in operation, are connected to the respective N power amplifier circuit cores; and
ring-oscillator-type transconductance (gm) generation circuitry, which in operation, generates gm for compensating power loss of the N inductors;
wherein the ring-oscillator-type gm generation circuitry includes N gm generation circuit cores, which in operation, are connected to each other in a ring form, and
each of the gm generation circuit cores includes a current adjustment terminal receiving a first control signal and a variable capacitor adjustment terminal receiving a second control signal, the first control signal being used for controlling a current flowing through each of the gm generation circuit cores, and the second control signal being used for controlling capacitance of a variable capacitor included in each of the gm generation circuit cores.

5. The power amplifier circuit according to claim 4, comprising:
a phase locked loop (PLL), which in operation, controls oscillation frequency of the ring-oscillator-type gm generation circuitry on the basis of the first control signal and the second control signal;
lock detection circuitry, which in operation, detects a lock state of the oscillation frequency of the ring-oscillator-type gm generation circuitry; and
power detection circuitry, which in operation, detects oscillation power at the oscillation frequency of the ring-oscillator-type gm generation circuitry.

6. The power amplifier circuit according to claim 5,
wherein the PLL controls the second control signal to minimize the capacitance of the variable capacitor,
after minimizing the capacitance of the variable capacitor, the PLL controls the first control signal to cause the ring-oscillator-type gm generation circuitry to output the oscillation power at the oscillation frequency, and
after the ring-oscillator-type gm generation circuitry outputs the oscillation power at the oscillation frequency, the PLL controls again the second control signal to increase the capacitance of the variable capacitor.

7. The power amplifier circuit according to claim 5,
wherein the PLL controls the second control signal to maximize the capacitance of the variable capacitor,
after maximizing the capacitance of the variable capacitor, the PLL controls the first control signal to cause the ring-oscillator-type gm generation circuitry to output the oscillation power at the oscillation frequency,
after the ring-oscillator-type gm generation circuitry outputs the oscillation power at the oscillation frequency, the PLL controls again the second control signal to lock the oscillation frequency by decreasing the capacitance of the variable capacitor stepwise with a first step width, and
after locking the oscillation frequency, the PLL controls again the second control signal to increase the capacitance of the variable capacitor stepwise with a second step width which is smaller than the first step width.

* * * * *